United States Patent
Inao (10) Patent No.: US 8,080,121 B2
(45) Date of Patent: Dec. 20, 2011

(54) METHOD OF BONDING, THINNING, AND RELEASING WAFER

(75) Inventor: Yoshihiro Inao, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 374 days.

(21) Appl. No.: 12/309,706

(22) PCT Filed: May 21, 2007

(86) PCT No.: PCT/JP2007/000540

§ 371 (c)(1),
(2), (4) Date: Jan. 27, 2009

(87) PCT Pub. No.: WO2008/012937

PCT Pub. Date: Jan. 31, 2008

(65) Prior Publication Data

US 2009/0199957 A1    Aug. 13, 2009

(30) Foreign Application Priority Data

Jul. 28, 2006   (JP) ................................ 2006-206319

(51) Int. Cl.
*B32B 37/14*   (2006.01)
*B32B 38/10*   (2006.01)

(52) U.S. Cl. ......... 156/155; 156/153; 156/154; 156/247

(58) Field of Classification Search .......... 156/153–155, 156/247
See application file for complete search history.

(56) References Cited

U.S. PATENT DOCUMENTS

| 6,524,701 | B1 | 2/2003 | Kondo et al. |
| 6,723,619 | B2 | 4/2004 | Nagamoto et al. |
| 6,762,074 | B1 | 7/2004 | Draney et al. |
| 6,803,293 | B2 * | 10/2004 | Yamamoto ................ 438/459 |

(Continued)

FOREIGN PATENT DOCUMENTS

EP    1354925 A1    10/2003

(Continued)

OTHER PUBLICATIONS

"International Application Serial No. PCT/JP2007/000540, International Search Report mailed Jun. 12, 2007", (w/ English Translation), 6 pgs.

(Continued)

*Primary Examiner* — Katarzyna Wyrozebski Lee
*Assistant Examiner* — Scott W Dodds
(74) *Attorney, Agent, or Firm* — Schwegman, Lundberg & Woessner, P.A.

(57) ABSTRACT

An adhesive agent layer for bonding a support plate (1) and a wafer (5) is in a three-layer configuration in which a hard layer (31) is sandwiched between soft layers (32) and (33) from above and below. Both the top and bottom surfaces of the adhesive agent layer are soft adhesive agent layers, which results in an excellent bonding affinity with the wafer 5 and the support plate (1). Accordingly, the peripheral portion of the wafer (5) can be prevented from being lifted before a dicing process. Further, because the sandwiched adhesive agent layer is the hard adhesive agent layer (31), even when the non-adhesive surface of the support plate (1) is vacuum suctioned, or when a pressure is applied from a grinder, the hard adhesive agent layer (31) is not deformed according to the soft adhesive agent layer (33) being drawn or pushed into through holes (2).

4 Claims, 6 Drawing Sheets

U.S. PATENT DOCUMENTS

| | | |
|---|---|---|
| 6,852,608 B2 | 2/2005 | Kitamura et al. |
| 7,094,618 B2 | 8/2006 | Tandy et al. |
| 7,268,061 B2 | 9/2007 | Miyanari et al. |
| 7,393,757 B2 | 7/2008 | Miyamoto et al. |
| 2003/0031862 A1 | 2/2003 | Yamamoto et al. |
| 2004/0161876 A1 | 8/2004 | Tandy et al. |
| 2005/0170612 A1 | 8/2005 | Miyanari et al. |
| 2005/0173051 A1 | 8/2005 | Hatai et al. |
| 2006/0269715 A1 | 11/2006 | Hatai et al. |
| 2008/0008881 A1* | 1/2008 | Yabuki et al. ................. 428/343 |

FOREIGN PATENT DOCUMENTS

| | | |
|---|---|---|
| JP | 7-45557 A | 2/1995 |
| JP | 2005-191550 A | 7/2005 |
| JP | 2006-12998 A | 1/2006 |
| JP | 2006-156683 A | 6/2006 |
| TW | 200305624 | 11/2003 |
| TW | 570967 B | 1/2004 |
| TW | 587986 B | 5/2004 |
| TW | 232235 B | 5/2005 |
| TW | 238182 B | 8/2005 |
| TW | 241674 B | 10/2005 |
| TW | 244133 B | 11/2005 |
| WO | WO 2005057651 A1 * | 6/2005 |

OTHER PUBLICATIONS

"International Application Serial No. PCT/JP2007/000540, Written Opinion mailed Jun. 12, 2007", (w/ English Translation), 7 pgs.

* cited by examiner

METHOD OF BONDING, THINNING, AND RELEASING WAFER

RELATED APPLICATION

This application is a nationalization under 35 U.S.C. 371 of PCT/JP2007/000540, filed May 21, 2007 and published as WO 2008/012937 A1 on Jan. 31, 2008, which claimed priority under U.S.C. 119 to Japanese Application No. 2006-206319, filed Jul. 28, 2006; which applications and publication are incorporated herein by reference and made a part hereof.

TECHNICAL FIELD

The present invention relates to a method by which a wafer is bonded to a support plate before the wafer is thinned by being ground and polished, to a method of thinning the wafer, and to a method of releasing the wafer.

BACKGROUND ART

Portable electronic devices such as IC cards, mobile phones, digital cameras, etc. are widely used. In recent years, there has been demand for all of these devices to become thinner, smaller, and lighter without exception.

In order to meet this demand, semiconductor chips used in these devices must also become thinner.

It has been said that the thickness of silicon wafers (simply referred to as a wafer or wafer chips hereinafter) used to produce semiconductor chips must be reduced to between 25 μm and 50 μm for the next-generation semiconductor chips, while the current wafer thickness is between 125 μm and 150 μm.

In the conventional methods of thinning wafers, protection tape is applied on the circuit formed surface of a wafer, the wafer is inverted, and the bottom surface of the wafer is ground with a grinder to become thinner. Thereafter, the bottom surface of the wafer is polished.

The bottom surface of the thinned wafer is seated on dicing tape held by a dicing frame, and the protection tape is peeled from the circuit formed surface of the wafer. Thereafter, the wafer is diced into chips using a dicing device.

However, in this method, breaks or cracks off are often made in a wafer when protection tape is peeled from the wafer. Further, a thinned wafer cannot be supported only on protection tape.

This requires that there be careful manual labor for transportation of such a wafer. Accordingly, processing steps cannot be automated.

In order to cope with this situation, a protection substrate obtained by impregnating a ladder type silicon oligomer to a stomatal sintered body of aluminum nitride-boron nitride is sometimes used instead of protection tape in order to hold wafers. In other cases, a protection substrate (support plate) consisting of alumina, alumina nitride, boron nitride, silicon carbide or the like, which have a thermal expansion rate substantially the same as that of the wafers, is used to hold the wafers.

In such cases, a wafer and a protection substrate have to be bonded together. For an adhesive material thermoplastic resin such as polyimide is used, specifically, a film of the thermoplastic resin with a thickness of between 10 μm and 100 mμ, or a film obtained by spin-coating adhesive resin solution and drying it with a thickness equal to or smaller than 20 mμ is used.

The above method, which uses a hard protection substrate, makes it possible to automate the handling and transport of wafers during processing steps.

However, this method uses a thermoplastic film that has been dried as an adhesive agent for bonding a protection substrate and a thermoplastic film, and thus a heating step has to be performed in order to soften the thermoplastic film when releasing the wafer from the protection substrate.

Softening a thermoplastic film that has been dried requires a high temperature, posing a high risk that circuits on a wafer may be damaged.

Further, the use of film adhesive causes a variation among portions in bonding strength so that some portions may be peeled when being polished and other portions may be difficult to be released when a wafer is released from the protection substrate, which are problematic.

In order to overcome this problem, Japanese Patent Application Publication No. 2005-191550 (See Abstract and FIG. 3) proposes a method in which a wafer is attached by using an adhesive agent to a support plate consisting of a rigid body with a number of through holes before the processes of grinding/polishing a wafer to a thinner state are performed in order to reduce the probability of making cracks in the wafers.

This method is advantageous in that an adhesive agent can be used highly efficiently because there are a number of through holes in the support plate, in that wafers are easy to handle even after being ground/polished into an extremely thin state because the support plate is a rigid plate made of the glass, or the like, and in that a release agent can easily penetrate an adhesive agent via the through holes provided to the support plate.

When a wafer is to be ground and polished, the bottom surface of the support plate holding the wafer is vacuum suctioned to be fixed to the processing stand.

If the adhesive agent layer is soft, the pattern of the through holes can be transferred to the circuit formation surface of a wafer because there are a number of through holes in the support plate as described above.

Also, the pressure from a grinding stone can sometimes cause the transfer of the pattern of through holes to a wafer in reality.

In order to prevent such transfers, anti-transfer sheets are used; however, the use of such sheets does not prevent the transfer of the through-hole pattern completely.

This problem can be solved by using harder adhesive agent layers. However, too hard an adhesive agent layer can cause a decrease in the bonding property, allowing the periphery of the wafer that has been thinned through grinding and polishing to be released and peeled from the adhesive agent layer.

Also, to a support plate, an adhesive agent layer is not applied but is adhered in a compression bonding method. This causes a problem wherein the bonding property of an adhesive agent layer that is too hard is low.

Accordingly, the thickness, material, and hardness, etc. of an adhesive agent have to be sufficiently adjusted in accordance with the thickness of the polished wafer, which is troublesome.

DISCLOSURE OF THE INVENTION

In order to solve one of the above problems, the method of bonding a wafer to a support plate according to the present invention is characterized by bonding a support plate and a wafer using a plurality of types of adhesive agents, including soft and hard types.

In such a case, the above adhesive agent consists of two layers, a hard adhesive agent layer and a soft adhesive agent layer; the hard layer of the adhesive agent is bonded to the wafer, and the soft layer of the adhesive agent is bonded to the support plate. As a matter of course, it is also possible for the hard layer to be bonded to the support plate and the soft layer to be bonded to the wafer.

As to the forming of the hard and soft layers, the hard layer and the soft layer may be sequentially formed on the wafer, and thereafter the support plate is bonded to the soft layer.

The above adhesive agent can consist of, for example, a three layer construction composed of different compositions of hard and soft layers.

In such a case, it would be advantageous for the adhesive agent to be in a three-layer configuration in which a hard layer is sandwiched between two soft layers.

In such a case, upon the formation of the three layers, a soft layer, a hard layer, and a soft layer may be formed sequentially on the wafer.

Also, the support plate may have a plurality of through holes. In such a case, it is desirable that the opening diameter of the through hole is between 200 μm and 700 μm and that the total opening area is equal to or greater than 20 percent of the area of a surface of the support plate.

In order to solve one of the above problems, in the method of thinning a wafer according to the present invention, a wafer bonded by one of the above wafer-bonding methods is ground or polished in order to be thinned.

Also, in order to solve another one of the above problems, in the method of releasing a wafer according to the present invention, a wafer thinned by the above method is released by dissolving an adhesive agent using a release agent.

According to the present invention, a wafer and a support plate are bonded by using a plurality of types of adhesive agent layers, including soft and hard layers, and accordingly a thinning/bonding method by which the pattern of through holes are not easily transferred to the thinned wafer and the peripheral portion of the wafer is not easily lifted when there are a number of through holes in the support plate can be provided.

Also, a wafer and a support plate are bonded by using a plurality of adhesive agent layers, including hard and soft layers, and accordingly the wafer is surely fixed to the support plate so that the wafer can be easily thinned by being ground/polished.

Also, after the thinning process, a release agent is used to dissolve the adhesive layers in order to release the wafer so that needless effects such as the effects of heat or the like are not applied to the circuit formation surface of the wafer from the external environment, resulting in a lower risk of damaging the wafer and a higher yield.

NUMERALS

1: support plate
2: through hole
3: hard adhesive agent layer
4: soft adhesive agent layer
5: wafer
6: support plate stocker
7: wafer cassette station
8: stacking apparatus
9: robot moving path
11: pasting device
12: robot
13: spin cup
14: flat finder/cool plate
15: bake/oven plate
16: application nozzle
17: upper protection cover
18: input display device
21: shaft
22: grinder
23: thin metal film
24: bottom-surface circuit
25: tape frame
26: die attach film (dicing tape)
27: release agent
28: handle jig
29: cleaning fluid
31: hard adhesive agent layer
32: soft adhesive agent layer
33: soft adhesive agent layer

BEST MODES FOR CARRYING OUT THE INVENTION

EXAMPLE 1

Figure 1A:
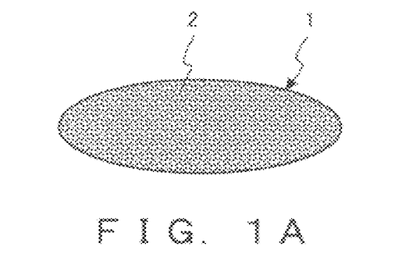
FIG. 1A is a perspective view schematically showing a configuration of a support plate used in a process of thinning a wafer executed in example 1.
Figure 1B:
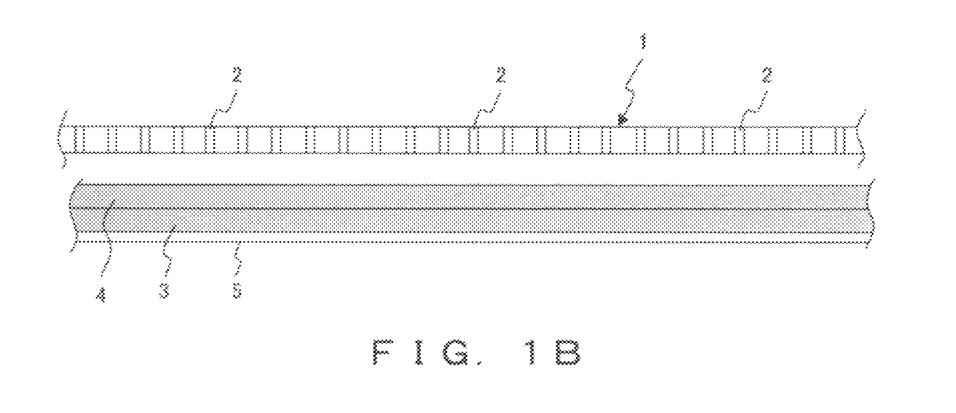
FIG. 1B is a cross-sectional view schematically showing a relationship between the support plate and the wafer when they are aligned with each other.
Figure 1C:
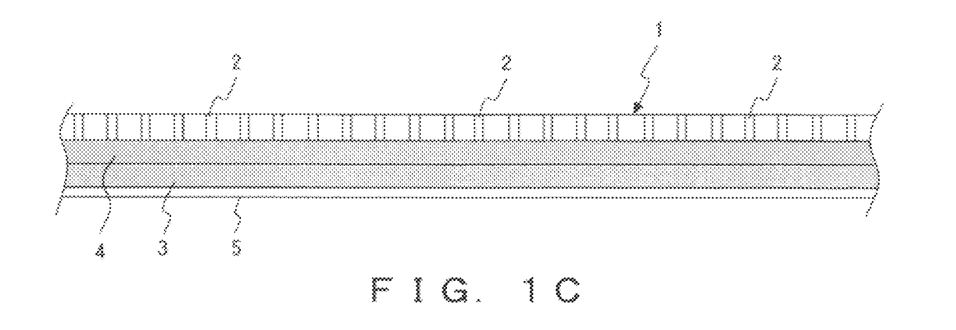
FIG. 1C is a cross-sectional view schematically showing the support plate and the wafer after they are bonded together by a thermal compression bonding method with an adhesive agent layer between them.

FIG. 1A is a perspective view schematically showing a configuration of a support plate used in a process of thinning a wafer executed in example 1. This process will be explained later. FIG. 1B is a cross-sectional view schematically showing the relationship between the support plate and the wafer when they are aligned with each other. FIG. 1C is a cross-sectional view schematically showing the state of the support plate and the wafer after they are bonded together by a thermal compression bonding method with an adhesive agent layer between them.

As shown in FIG. 1A, a support plate 1 is a rigid-body circular glass plate.

As shown in FIG. 1A, a number of micro through holes 2 are formed evenly throughout the entire surface of the support plate 1.

Figure 2A:
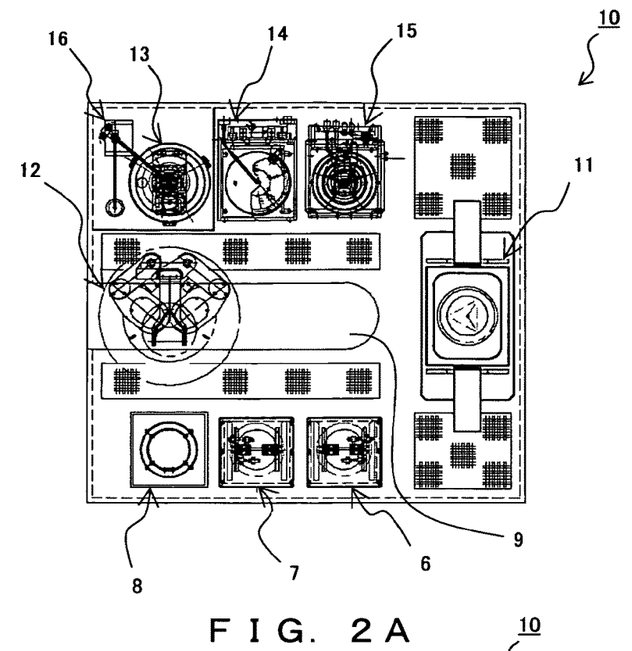
FIG. 2A is a transparent plan view showing a pasting apparatus for adhering the support plate to the wafer with the adhesive layers between them in example 1.
Figure 2B:
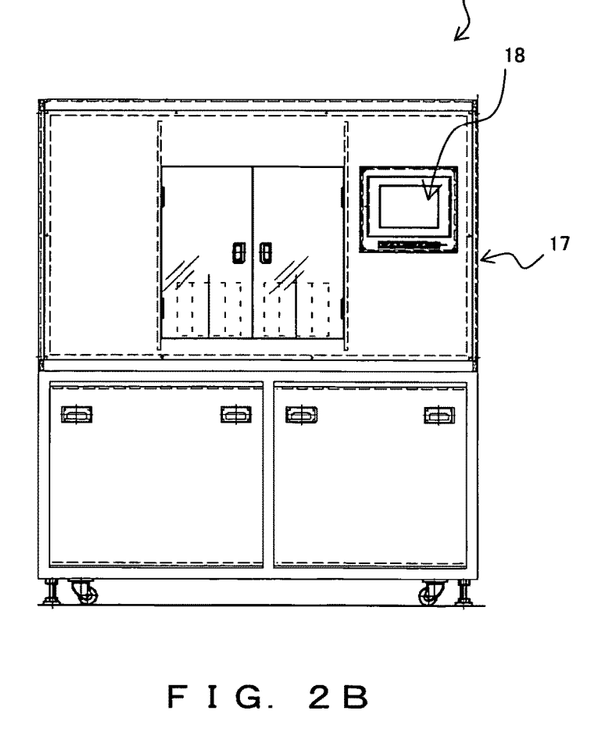
FIG. 2B is a front view showing the pasting apparatus for adhering the support plate to the wafer with the adhesive agent layers between them in example 1.

As shown in FIG. 2B, the support plate 1 is aligned with a wafer 5 in an adhering apparatus. A plurality of types of adhesive agent layers including hard and soft types (a hard adhesive agent layer 3 and a soft adhesive agent layer 4 in this example) have been applied to the circuit formation surface of the wafer 5.

Thereafter, heat and pressure are applied to the support plate 1 and the wafer 5 so that they are adhered to each other with the hard adhesive agent layer 3 and the soft adhesive agent layer 4 between them.

In this adhesion using the two types (hard and soft) of adhesive agent layers, the soft adhesive agent layer 4 is bonded to the support plate 1 and the hard adhesive agent layer 3 is bonded to wafer 5 as shown in FIG. 1C.

In the above bonding of the support plate 1 and the wafer 5 to the hard and soft adhesive agent layers, they can be bonded in the opposite combination i.e., the soft adhesive agent layer 3 can be bonded to the support plate 1 and the hard adhesive agent layer 4 can be bonded to the wafer 5.

FIG. 2A is a transparent plan view showing a pasting apparatus for adhering the support plate 1 to the wafer 5 with the adhesive layers between them as described above. FIG. 2B is a front view showing the pasting apparatus.

As shown in FIG. 2A, a pasting apparatus 10 includes, around a portion close to the front surface, a support plate stocker 6 for holding a plurality of support plates 1 that have not been used yet, a wafer cassette station 7 for holding a plurality of cassettes that have received wafers on which circuits are formed, and a stacking apparatus 8.

Around the central portion, a robot moving path 9 that occupies approximately two thirds of the left side is formed. To the right of the robot moving path 9, a pasting device 11 for pasting the support plate 1 and the wafer 5 that have been combined through the adhesion is disposed. To the left of the robot moving path 9, a robot 12 is disposed.

A spin cup 13 for applying an adhesive agent to wafers 5 is disposed around a portion close to the back surface of the apparatus. To the right of the spin cup 13, a flat finder/cool plate 14 and a bake/oven plate 15 are arranged. An application nozzle 16 is disposed near the spin cup 13.

As shown in FIG. 2B, on the right side of the upper front surface of an upper protection cover 17 of the pasting apparatus 10, an input/display device 18 for displaying desired information while input operation is disposed. The operator gives instructions while watching information displayed on this input/display device 18 in order to control the operations of the devices in the pasting apparatus 10.

Figure 3:
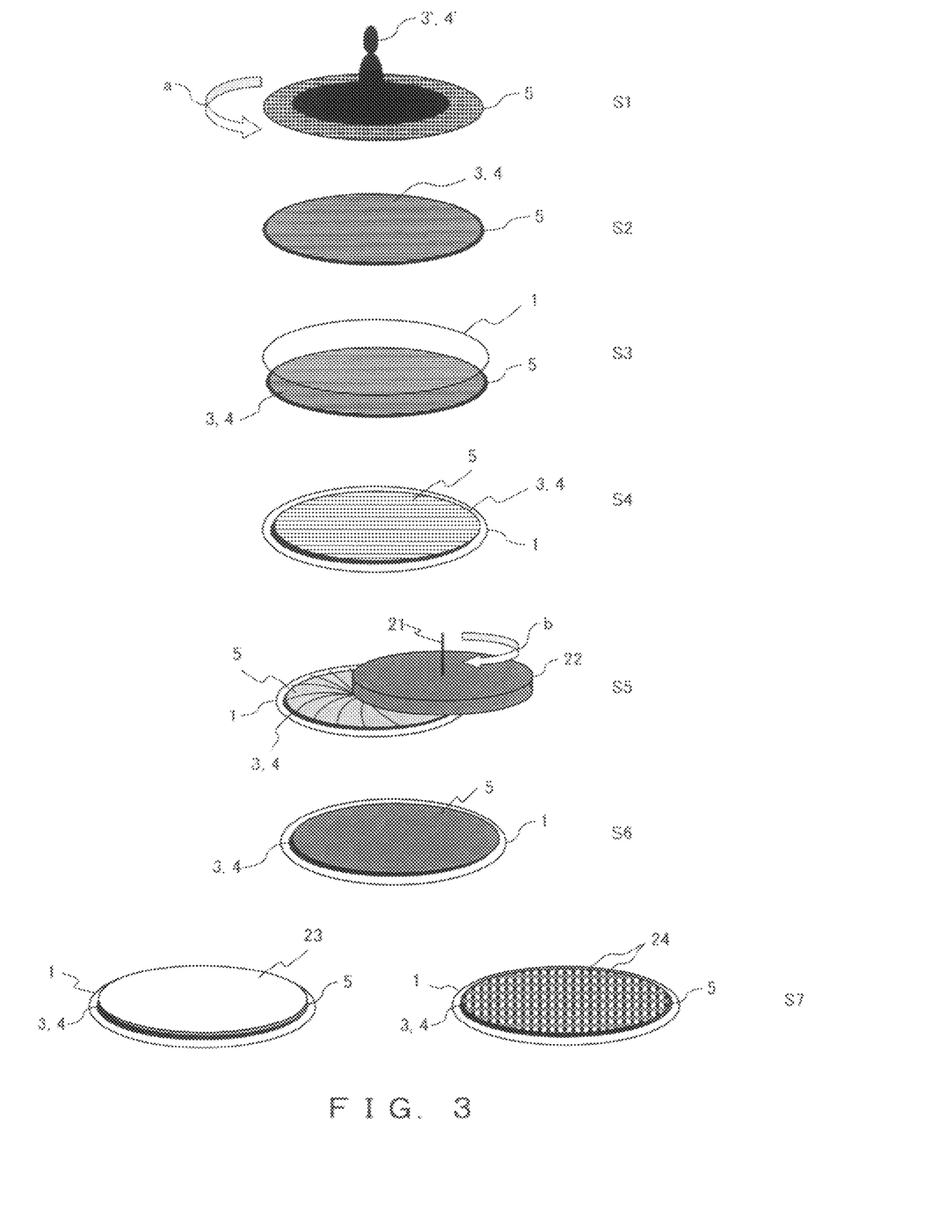
FIG. 3 schematically shows steps of adhering the wafer to the support plate and of thinning the wafer.

FIG. 3 schematically shows steps of adhering the wafer 5 to the support plate 1 and of thinning the wafer 5. This process starts when the instruction is given from the operator via the input/display device 18.

In step 1, the robot 12 shown in FIG. 2 moves to the right and left along the robot moving path 9, turns, and extends and contracts the arm in order to set a wafer 5 picked up from the wafer cassette station 7 on the processing stand of the spin cup 13.

The spin cup 13 spins the wafer 5 on the processing stand 5 in the direction of arrow a as shown in FIG. 3. Thereafter, a liquid adhesive agent 3' is dropped onto a surface of the wafer 5 so that the surface is spin coated. Thereby, the entire upper surface (circuit formation surface) of the wafer 5 is evenly coated with the liquid adhesive agent 3'.

As a method of coating an adhesive agent, other methods such as a method in which an applicator is used to apply an adhesive agent in a manner of rolling out dough by using a rolling pin or a method in which a slit nozzle having a width of at least the diameter of the wafer 5 is used to apply an adhesive agent can be used.

An adhesive agent with a high softening temperature (such as one made from acrylic materials) is used because processes at a high temperature such as a process of attaching a DAF (die attach film) will be conducted.

In step S2, the robot 12 picks up from the spin cup 13 the wafer 5 to which the adhesive agent has been applied. The wafer 5 is then moved to the bake/oven plate 15.

In the bake/oven plate 15, the above liquid adhesive agent 3' is dried and its fluidity is reduced. The hard adhesive layer 3 is kept in a layered state. In this drying process, the liquid adhesive agent 3' is heated for a prescribed time period at temperatures of, for example, between 40° C. and 200° C.

The thickness of the hard adhesive agent layer 3 is determined by the convex and concave portions of the circuits formed on the adhesive agent surface of the wafer 5. The resin to be used as the material of the hard adhesive agent layer 3 is selected such that the hard adhesive agent layer 3 will become an adhesive agent layer that is relatively hard after a thermal compression bonding step. The thermal compression bonding step will be explained later.

Next, the same processes as in the above steps S1 and S2 are repeated in order to form the soft adhesive agent layer 4 on the hard adhesive agent layer 3. The resin to be used as the material of the soft adhesive agent layer 4 is selected such that the soft adhesive agent layer 4 will become an adhesive agent layer that is relatively soft after the thermal compression bonding step.

When the opposite bonding combinations of the hard and soft adhesive layers is employed between the support plate 1 and the wafer 5 as described above, the hard adhesive agent layer 3 is applied to the wafer 5 prior to the application of the soft adhesive agent layer 4 in steps S1 and S2.

In step S3, the wafer 5 and the support plate 1 are aligned with each other. For this alignment, the robot 12 picks up the wafer 5 from the bake/oven plate 15 and sets the wafer 5 on the stacking stand of the stacking apparatus 8.

Next, the robot 12 picks up the support plate 1 from the support plate stocker 6, and lays the support plate 1 on the wafer 5 set on the stacking stand of the stacking apparatus 8 in order to align them with each other.

In step S4, the wafer 5 and the support plate 1 that have been stacked on each other in the above manner are bonded by a thermal compression bonding method with the hard and soft adhesive agent layers 3 and 4 between them.

For this thermal compression bonding, the robot 12 picks up the support plate 1 and the wafer 5 that have been stacked and aligned, and moves them to the pasting device 11.

The above thermal compression bonding is performed in the decompression chamber in the pasting device 11 at temperatures ranging from, for example, 40° C. through 300° C. This thermal compression bonding makes the wafer 5 and the support plate 1 be in a temporary combined state.

As described above, a rigid material such as glass is used for the support plate 1, and accordingly the combined body consisting of the wafer 5 and the support plate 1 is easy to handle.

When the thermal compression bonding is completed, the combined body is picked up by the robot 12 from the decompression chamber, and is subjected to natural cooling in a cooling area (not shown).

In step S5, an anti-transfer sheet (not shown) is applied on the bottom surface of the support plate 1 (the surface opposite to the wafer-supporting surface) in the combined body that has been cooled.

Thereafter, the combined body that has been cooled is brought to a grinding apparatus (not shown), and is fixed to the processing stand with the support plate 1 vacuum suctioned to the stand.

Thereafter, a grinder 22 held at the tip of a shaft 21 of the grinding apparatus spins in the direction of arrow b in order to grind the bottom surface (non-bonded surface) of the wafer 5 to a prescribed thickness.

Instep S6, the bottom surface (non-bonded surface) of the wafer 5 that has been roughly ground by the grinder 7 is polished to a mirror-smooth state.

The execution of subsequent step S7 is not an essential step. In step S7, a back metallization process in which a metal thin film 23 is formed on the mirror-finished bottom surface of the wafer 5 or a process in which a bottom-surface circuit 24 is formed on the mirror-finished bottom surface of the wafer 5 is performed.

In some cases, one of the above processes is selected to be executed, and in other cases, none of them is executed.

Subsequent to the above process, the releasing process is executed.

Figure 4:
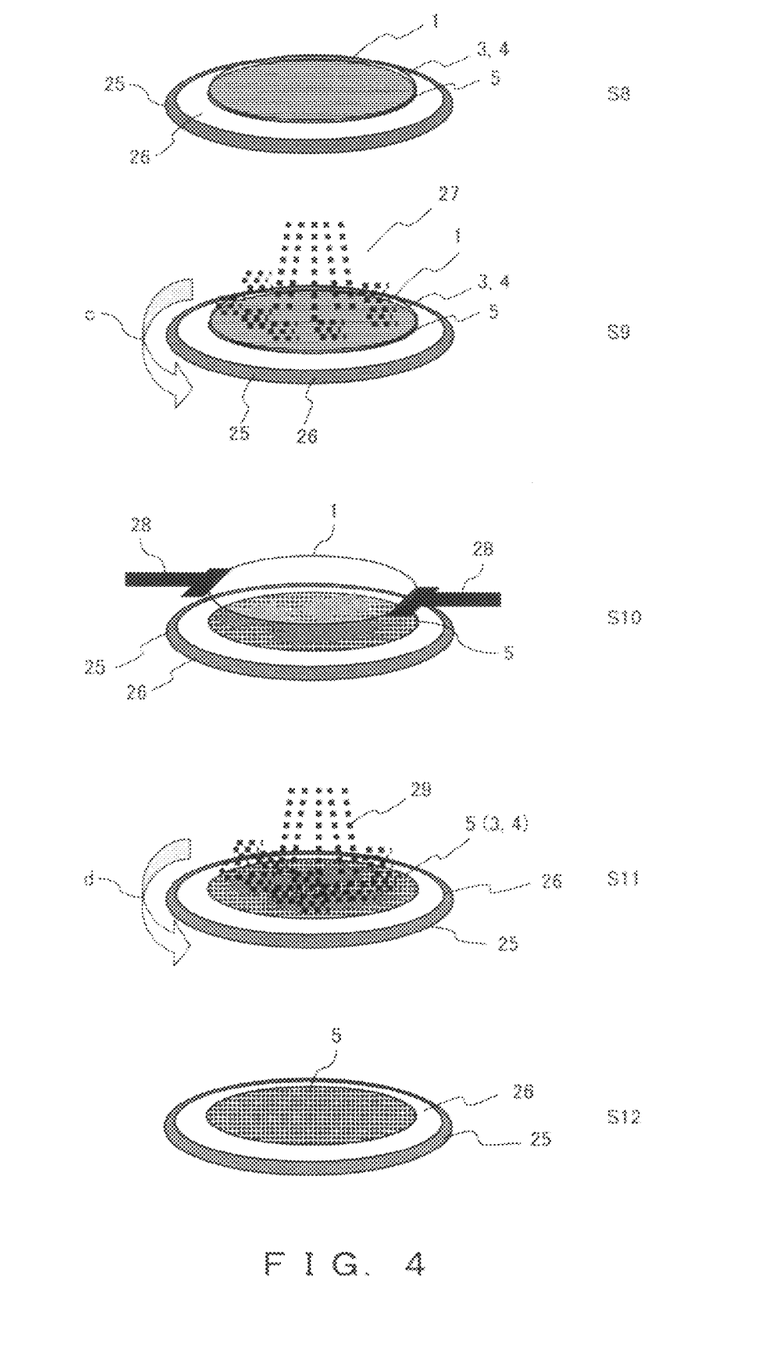
FIG. 4 shows steps in a process of releasing the thinned wafer from the support plate.

FIG. 4 shows steps in the releasing process. In step S8, dicing tape is applied on a surface on which circuits are not formed. A solvent supply plate (not shown) is pressed onto the support plate 1.

A solvent (a release agent 27) is supplied from a solvent supply hole in the solvent supply plate, and the release agent 27 penetrates the adhesive agent layer via the through holes 2 in the support plate 1. Thereby, the release agent 27 is supplied to the entire wafer.

Thus, the release agent 27 enters the through holes 2 in the support plate 1 (see FIGS. 1A, 1B, and 1C), and penetrates the hard adhesive agent layer 3 and the soft adhesive agent layer 4 in order to dissolve them gradually.

In step S10, handle jigs 28 are used to remove the support plate 1 from the wafer 5.

In this method, the process does not wait until the hard adhesive agent layer 3 and the soft adhesive agent layer 4 are dissolved completely, but the support plate 1 is removed from the wafer 5 when they have been dissolved enough to allow for their removal, and this results in an increase in throughput.

Thereafter, in step S11, the hard adhesive agent layer 3 and the soft adhesive agent layer 4 remaining on the surface of the wafer 5 are removed by using a cleaning fluid 29.

Because the adhesive agent layers bonding the wafer 5 and the support plate 1 include hard and soft adhesive agents, the pattern of the through holes 2 is not transferred to the wafer 5 even when the non-adhesive surface of the support plate 1 is vacuum suctioned to the grinding apparatus or when a pressure is applied from the grinder 22 or a polishing device.

In other words, even when the soft adhesive agent layer 4 on the support plate 1 side is slightly drawn or pushed into the through holes 2, the hard adhesive agent layer 3 is not deformed by the soft adhesive agent layer 4 being drawn or pushed into the through holes 2 because the hard adhesive agent layer 3 on the side of the wafer 5 is highly resistant to deformation. Accordingly, the pattern of the through holes 2 is not transferred to the wafer 5 after the releasing process.

Thereafter, the wafer 5 is diced using a diamond dicing saw into a plurality of chips. The singulated chips are released from dicing tape 26, and are supplied to a wire bonding device.

The relationship between the hardness of adhesive agents and transferability and the relationship between the hardness of adhesive agents and bonding power will be explained in brief.

Figure 5A:
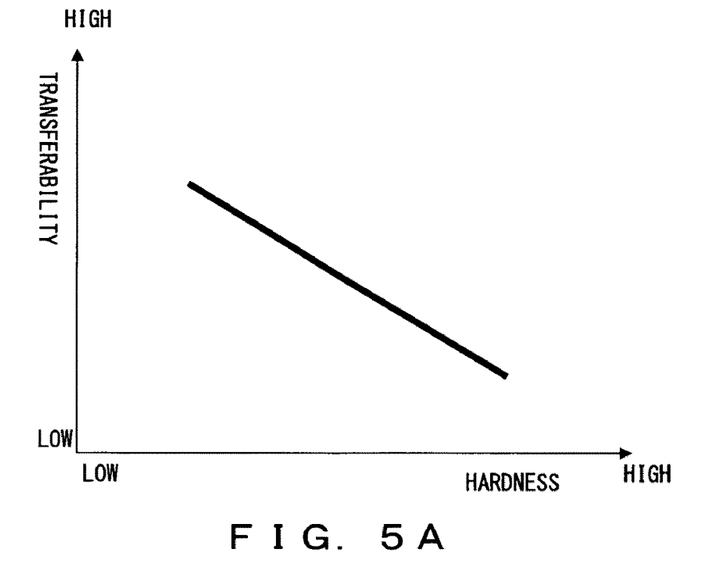
FIG. 5A is a characteristic graph showing a relationship between the hardness of an adhesive agent and the transferability.
Figure 5B:
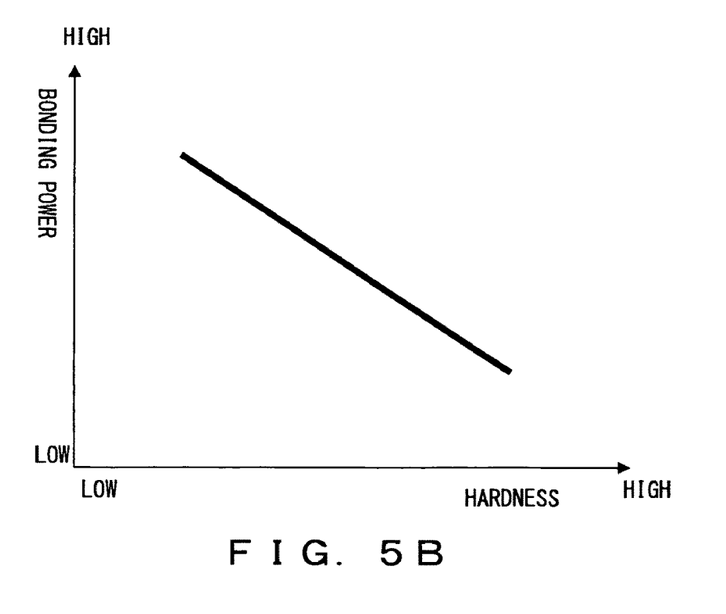
FIG. 5B is a characteristic graph showing a relationship between the hardness of an adhesive agent and the bonding power.

FIG. 5A is a characteristic graph showing a relationship between the hardness of an adhesive agent and the transferability. FIG. 5B is a characteristic graph showing a relationship between the hardness of an adhesive agent and the bonding power.

In FIG. 5A, the vertical axis represents the transferability. On the vertical axis, the transferability is lowest at the origin and becomes higher with increasing distance from the origin. The horizontal axis represents the hardness of an adhesive agent. On the horizontal axis, the hardness is lowest at the origin and becomes higher with increasing distance from the origin.

In FIG. 5B, the vertical axis represents the bonding power. On the vertical axis, the bonding power is lowest at the origin and becomes higher with increasing distance from the origin. The horizontal axis represents the hardness of an adhesive agent. On the horizontal axis, the hardness is lowest at the origin and becomes higher with increasing distance from the origin.

As is seen in FIG. 5A, when the hardness of an adhesive agent is low, the transferability is high, and when the hardness of an adhesive agent is high, the transferability is low.

Accordingly, when a consideration is given only to lowering the transferability, the higher the hardness of an adhesive agent is, the better the adhesive agent is.

However, as is seen in FIG. 5B, when the hardness of an adhesive agent is low, the bonding power is high, and when the hardness of an adhesive agent is high, the bonding power is low.

Accordingly, when consideration is given only to increasing the bonding power, the lower the hardness of an adhesive, the better the adhesive agent is.

Accordingly, the hardness and the transferability/bonding power of an adhesive agent are in a trade-off relationship. On the basis of this trade-off relationship, a material that yields a sufficient bonding power and does not cause any transfer has to be selected for the hard adhesive agent layer 3 to be bonded to the wafer 5.

Further, as the transferability is also influenced by the diameter of the through holes 2 in the support plate 1, a proper material for the hard adhesive agent layer 3 is to be selected considering also the thickness of the adhesive agent layer, which is determined by the size of the wafer 5 and the state of the circuits formed on the wafer 5.

Additionally, even when the hard adhesive agent layer 3 is not bonded to the wafer 5, but is bonded to the support plate 1, the same effect of suppressing the transferability is obtained.

EXAMPLE 2

Figure 6:
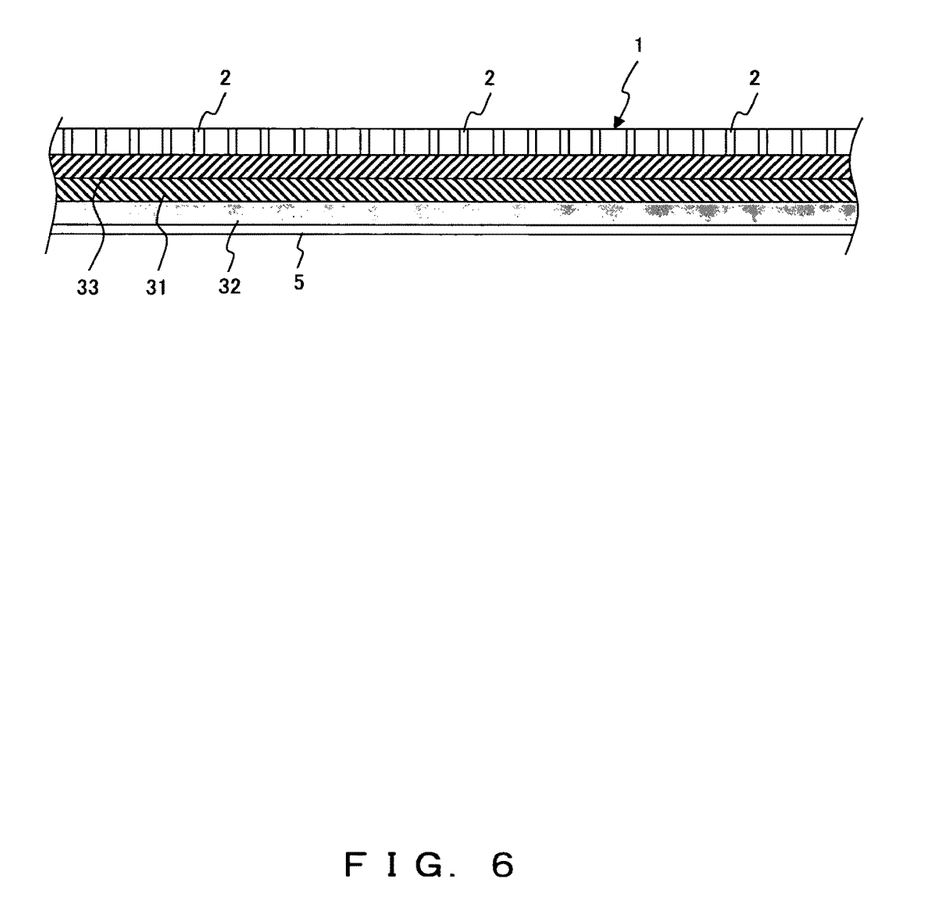
FIG. 6 is a cross-sectional view schematically showing the state of a support plate and a wafer that have been bonded with adhesive agent layers between them by a thermal compression bonding method executed before the wafer is thinned by being ground/polished in example 2.

FIG. 6 is a cross-sectional view schematically showing a state of a support plate and wafer that have been bonded with adhesive agent layers between them by a thermal compression bonding method, which is executed before the wafer is thinned by being ground/polished in the process of thinning a wafer explained in example 2.

As shown in FIG. 6, the support plate 1 and the wafer 5 are bonded together with three layers, i.e., a hard adhesive agent layer 31 between soft adhesive agent layers 32 and 33.

One of the two soft adhesive agent layers is bonded to the wafer 5 (the soft adhesive agent layer 32 at the bottom in FIG.

6), and the other of the soft adhesive agent layers is bonded to the support plate 1 (the soft adhesive agent layer 33 at the top in FIG. 6).

It is possible to apply the above three adhesive agent layers by repeating steps S1 and S2 shown in FIG. 3. It is also possible to first apply the soft adhesive agent layer 32 and thereafter stack sheets of the hard adhesive agent layer 31 and the soft adhesive agent layer 33 on the soft adhesive agent layer 32 to be bonded by the thermal compression bonding method.

The same material as that for the soft adhesive agent layer 4 shown in FIG. 1 can be used for the soft adhesive agent layers 32 and 33, and the same material as that for the hard adhesive agent layer 3 shown in FIG. 1 can be used for the hard adhesive agent layer 31.

In the present example, both the top and bottom layers are of soft adhesive agents, and accordingly the affinity (bonding property) with the wafer 5 and the support plate 1 is excellent, preventing the peripheral portion of the wafer 5 thinned in the grinding process from being lifted when releasing before the dicing process.

Also in this example, the pattern of the through holes 2 is not transferred to the wafer 5 even when the non-adhesive surface of the support plate 1 is vacuum suctioned to a grinding apparatus or when a pressure is applied when the wafer is ground/polished.

In other words, even when the soft adhesive agent layer 33 on the support plate 1 side is slightly drawn or pushed into the through holes 2, the soft adhesive agent layer 32 on the wafer 5 side is not deformed by being pushed into the through holes 2 because the hard adhesive agent layer 31 that is between the two soft adhesive agent layers is highly resistant to deformation. Accordingly, the pattern of the through holes 2 is not transferred to the wafer 5 after the releasing process.

In addition, the use of a similar resin for the soft and hard adhesive agent layers makes the affinity between them high so that no particular consideration need be given to the bonding property between them In both of the above examples, the circuit formation surface of the wafer 5 is adhered to the adhesive agent layer. However, both surfaces of the support plate 1 have completely identical properties, and accordingly either surface of the support plate 1 may be adhered to the adhesive layers.

In addition, upon the formation of the three layers of adhesive agents, it is also possible to sequentially form the hard layer, the soft layer, and the hard layer on the wafer in order to bond the support plate to the exposed hard layer.

The invention claimed is:

1. A method of bonding a wafer comprising:
   bonding a support plate and a wafer by heat and pressure, using a plurality of types of adhesive agents including soft and hard types, wherein:
   the adhesive agent consists of three layers composed of hard and soft adhesive agent, and is in the three-layer configuration in which the hard layer is sandwiched between the soft layers from above and below;
   the support plate has a plurality of through holes;
   an opening diameter of the through hole is equal to or smaller than 400 μm, and a total opening area is equal to or greater than 20 percent of an area of a surface of the support plate;
   and releasing the wafer by penetrating solvent through the plurality of holes.

2. The method of bonding a wafer according to claim 1, wherein:
   the soft layer, the hard layer, and the soft layer are formed sequentially on the wafer.

3. A method of thinning a wafer, comprising:
   grinding or polishing the wafer bonded by the method of bonding a wafer according to claim 1 in order to thin the wafer.

4. A method of releasing a wafer, comprising:
   dissolving an adhesive agent using a release agent in order to release the wafer thinned by the method of thinning a wafer according to claim 3.

* * * * *